US005419041A

United States Patent [19]
Ozeki

[11] Patent Number: 5,419,041
[45] Date of Patent: May 30, 1995

[54] PROCESS FOR MANUFACTURING A PIN TYPE RADIATING FIN

[75] Inventor: Tamio Ozeki, Tokyo, Japan

[73] Assignee: Aqty Co., Ltd., Tokyo, Japan

[21] Appl. No.: 93,344

[22] Filed: Jul. 16, 1993

[30] Foreign Application Priority Data

Aug. 4, 1992 [JP] Japan .................................. 4-207941
Sep. 17, 1992 [JP] Japan .................................. 4-247977

[51] Int. Cl.⁶ .......................................... B23P 15/26
[52] U.S. Cl. .................................. 29/890.03; 29/557; 165/80.3
[58] Field of Search .................. 165/185, 80.3; 83/32, 83/55; 29/890.03, 6.1, 557, 558

[56] References Cited

U.S. PATENT DOCUMENTS

| 2,549,466 | 4/1951 | Hoheisel | 29/6.1 |
| 5,020,586 | 6/1991 | Mansingh | 165/80.3 |
| 5,095,973 | 3/1992 | Toy | 29/890.03 |
| 5,184,281 | 2/1993 | Samarov et al. | 165/80.3 |
| 5,195,576 | 3/1993 | Hatada et al. | 165/80.3 |
| 5,199,164 | 4/1993 | Kim et al. | 165/80.3 |
| 5,241,452 | 8/1993 | Kitajo | 165/80.3 |

FOREIGN PATENT DOCUMENTS

| 57-22834 | 2/1982 | Japan | 83/32 |
| 199736 | 7/1992 | Japan . | |

Primary Examiner—Irene Cuda
Attorney, Agent, or Firm—Darby & Darby

[57] ABSTRACT

A process for manufacturing a pin type radiating fin comprising the steps of forming a constituent unitary body, which comprises a connecting element and a plurality of slender bars, by means of punching out a metal plate, and connecting a suitable number of such obtained constituent unitary bodies to each other in superimposed relation at the connecting elements respectively.

31 Claims, 6 Drawing Sheets

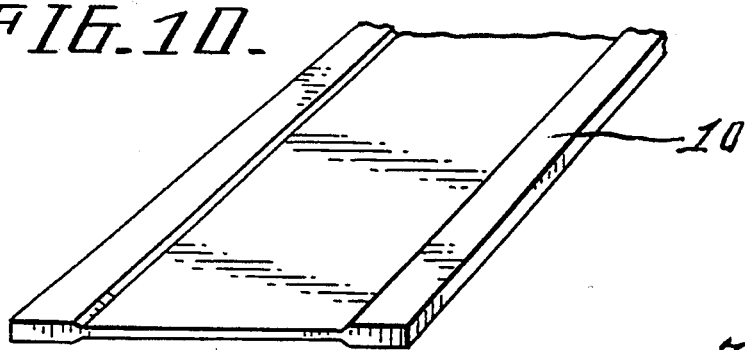
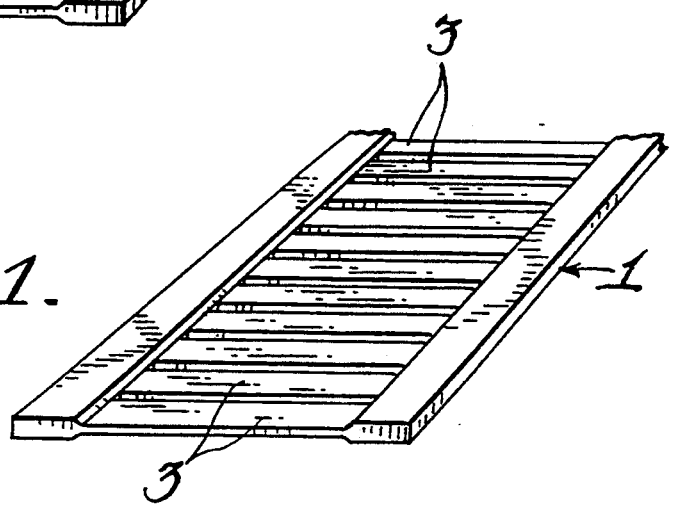
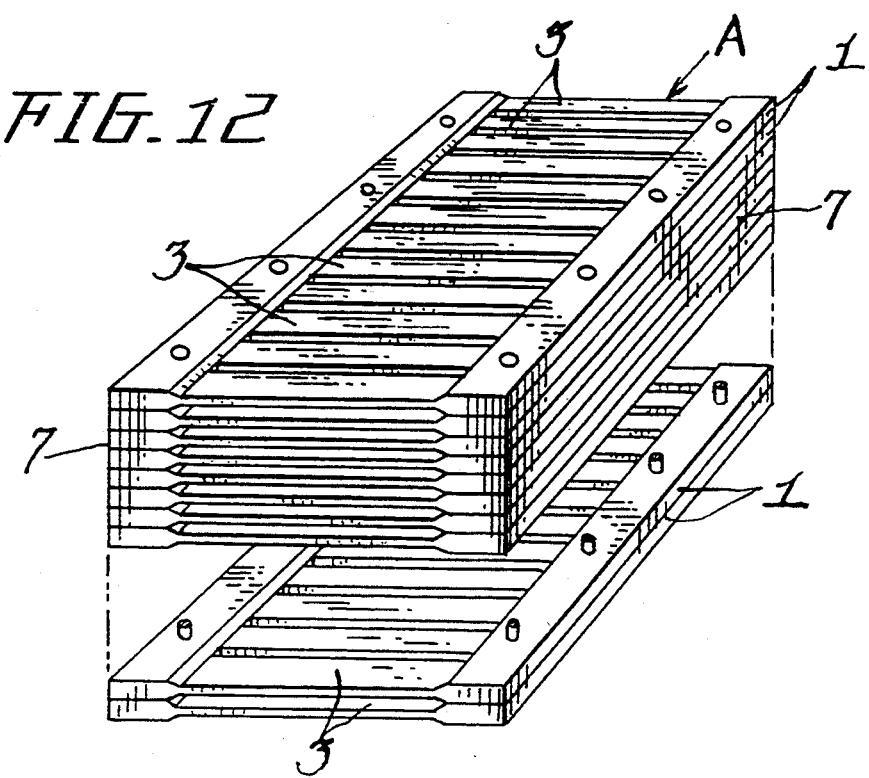

PROCESS FOR MANUFACTURING A PIN TYPE RADIATING FIN

BACKGROUND OF THE INVENTION

1. Field of the Invention

This invention relates to a pin type radiating fin which is mounted on various kinds of electronic devices such as LSI packages and the like in order to obtain a radiation effect. The invention also relates to a process for manufacturing the pin type radiating fin.

2. Brief Description of the Prior Art

As one example of the prior art relating to a process for manufacturing a pin type radiating fin, there is a technique disclosed in Early Disclosure No. 199736 of Japanese Patent Application filed in 1992.

According to this prior art, a constituent unitary body, which constitutes a pin type radiating fin, comprises a flat basic plate and a single pin erected from the flat basic plate. A plurality of such obtained constituent unitary bodies are connected to each other at edge portions of their basic plates by adhesive agent or braze having a low melting point such as solder, thereby forming a pin type radiating fin having a plurality of radiating pins. The constituent unitary bodies are produced by means of a conventional metal machining technique such as pressing, die-cast or etching.

However, this conventional method has the following inconveniences. Since each of the constituent unitary body comprises a basic plate and a single pin erected from the basic plate, the work for connecting the constituent unitary bodies to each other in order to obtain the pin type radiating fin is troublesome. Particularly, in order to obtain a small-sized pin type radiating fin, it is necessary to form the constituent unitary bodies themselves small in size, and as a result, the work for connecting the constituent unitary bodies becomes more troublesome and it sometimes becomes impossible to manufacture the pin type radiating fins depending on their sizes by the conventional method.

The present invention has been achieved in view of the above inconveniences inherent to the prior art.

SUMMARY OF THE INVENTION

It is therefore an object of the present invention to provide a process for manufacturing a pin type radiating fin, in which the work for connecting constituent unitary bodies to each other is not troublesome.

Another object of the present invention is to provide a process for manufacturing a pin type radiating fin which can be easily obtained irrespective of the size of the constituent unitary bodies.

A further object of the present invention is to provide a process for manufacturing a pin type radiating fin which is capable of providing a favorable radiating effect for a pair of electronic devices.

To achieve the above object, according to the present invention, there is provided a process for manufacturing a pin type radiating fin comprising forming a constituent unitary body, which comprises a connecting element and a plurality of slender bars, by means of punching out a metal plate, and connecting a suitable number of such obtained constituent unitary bodies to each other in superimposed relation at the connecting elements respectively.

From another aspect of the present invention, there is provided a pin type radiating fin comprising a suitable number of slender bars disposed between a pair of basic plates through which the pin type radiating fin is mounted on an electronic device.

BRIEF DESCRIPTION OF THE DRAWINGS

FIGS. 10 to 12 show a third embodiment of the present invention, FIG. 10 is a perspective view of a material plate, FIG. 11 is a perspective view of constituent unitary bodies, and FIG. 12 is a perspective view of a pin type radiating fin.

DETAILED DESCRIPTION OF THE EMBODIMENT

In general, a process of the present invention is carried out in the following manner. An aluminum material plate is pressed in such a manner as to form a constituent unitary body. Such obtained constituent unitary body is used as it is, or such constituent unitary body is subjected to secondary treatment, and then a suitable number of such constituent unitary bodies are connected to each other to form a pin type radiating fin.

First Embodiment

Figure 1:
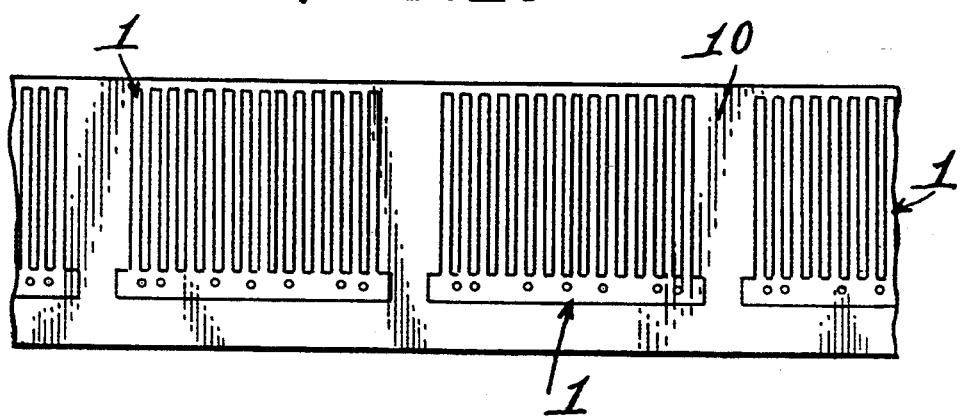
FIG. 1 is a front view showing a relation between a material plate and constituent unitary bodies according to a first embodiment of the present invention.
Figure 2:
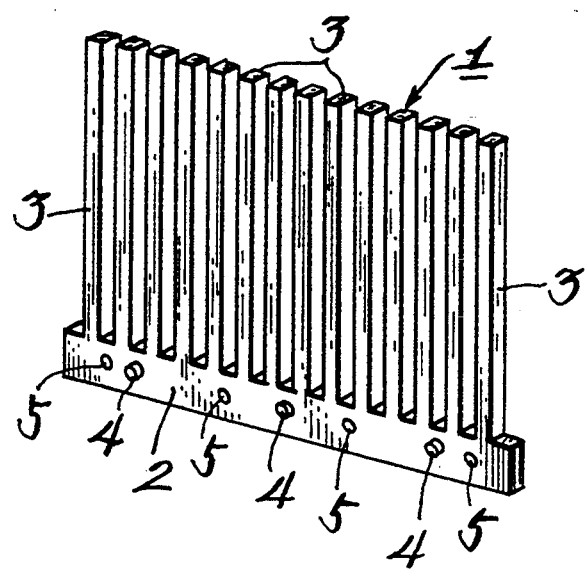
FIG. 2 is a perspective view of one of the constituent unitary bodies.

FIGS. 1 to 4 show a first embodiment. As shown in FIG. 1, a first step is to simultaneously obtain a plurality of constituent unitary bodies from an aluminum material plate 10. As shown in FIG. 2, each of the constituent unitary bodies 1, which are obtained in the first step, includes a connecting element 2, and a suitable number of slender bars 3 arrayed along a longitudinal end of the connecting element 2. The connecting element 2 is provided at suitable locations thereof with engagement projections 4 and engagement recesses 5 which are to be engaged with the counterparts of an adjacent constituent unitary body 1 respectively. These engagement projections 4 and engagement recesses 5 are formed simultaneously with the pressing operation of the aluminum material plate 10. However, they may be formed at different time.

Figure 3:
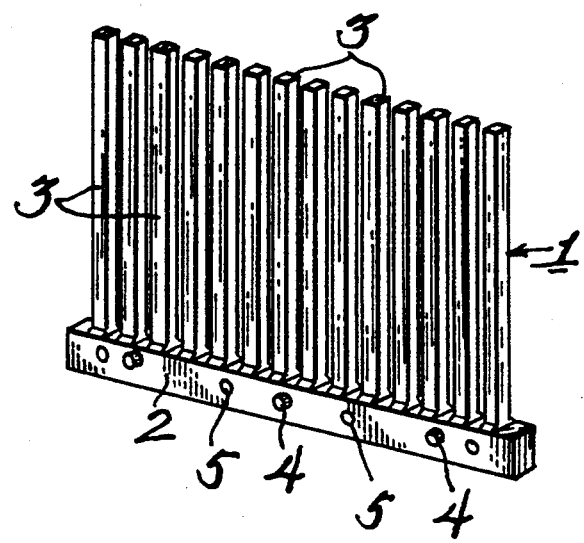
FIG. 3 is a perspective view of the constituent unitary body after it is subjected to secondary treatment.
Figure 4:
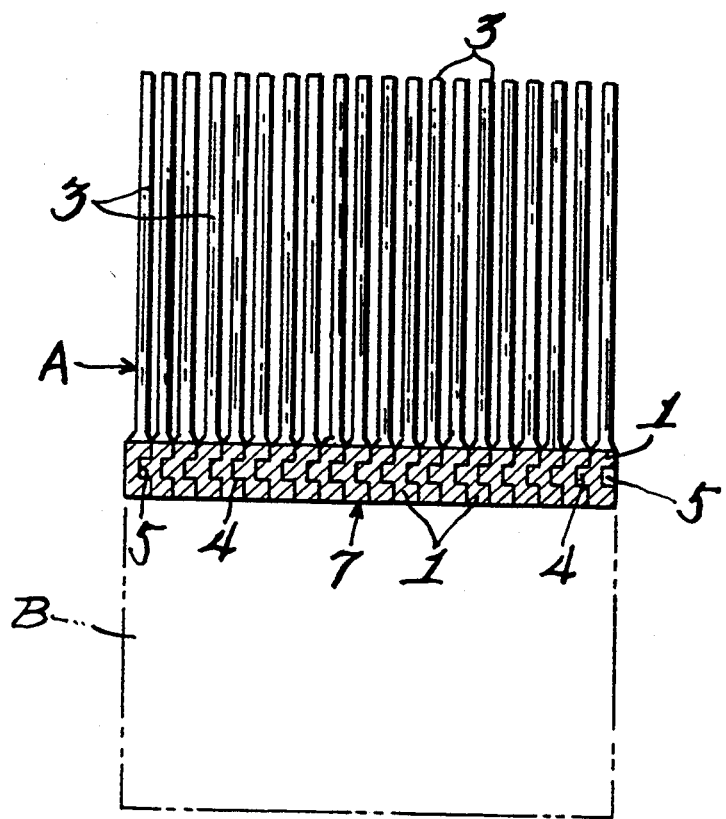
FIG. 4 is a cross-sectional view of a pin type radiating fin.
Figure 5:
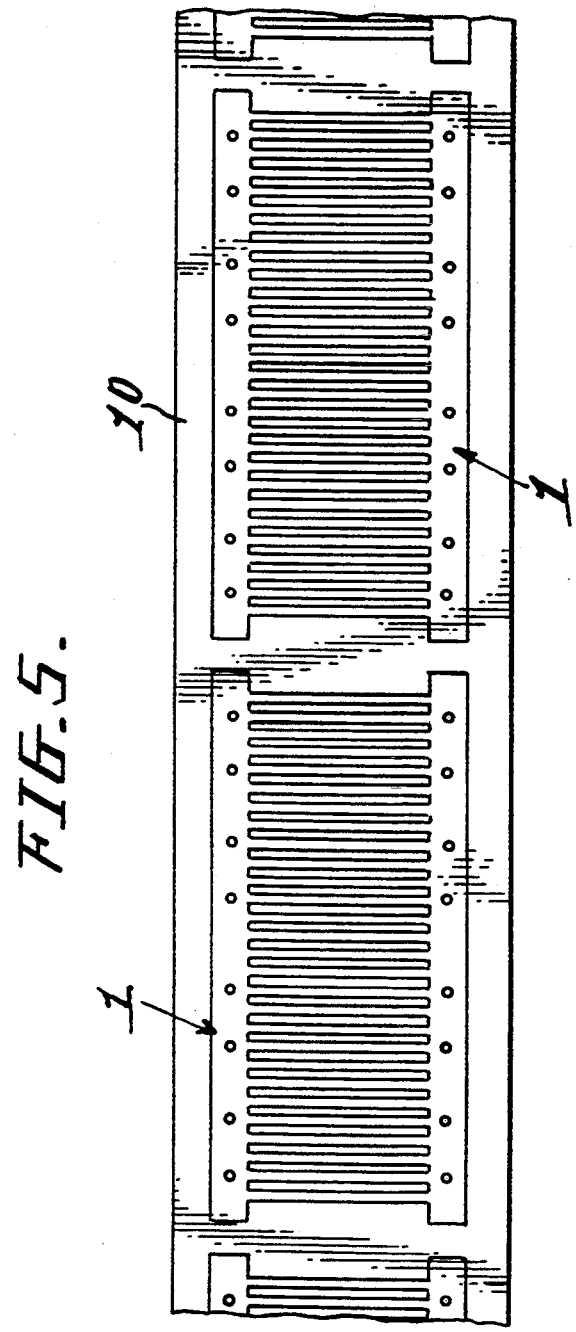
FIG. 5 is a front view showing a relation between a material plate and constituent unitary bodies according to a second embodiment of the present invention.

As shown in FIG. 3, the slender bars 3 portion is compressed by means of pressing so as to be thinner than the connecting portion 2, and thereafter the engagement projections 4 and the engagement recesses 5 are brought into engagement with each other, respectively, in order to connect the plurality of constituent unitary bodies 1 to each other. By fixing this connecting condition with suitable means, there can be obtained a pin type radiating fin A. An electronic device B such as an LSI package or the like is mounted on one surface of a basic plate 7 of this pin type radiating fin A, so that the latter can be used a radiator of heat produced by the electronic device B.

Figure 9:
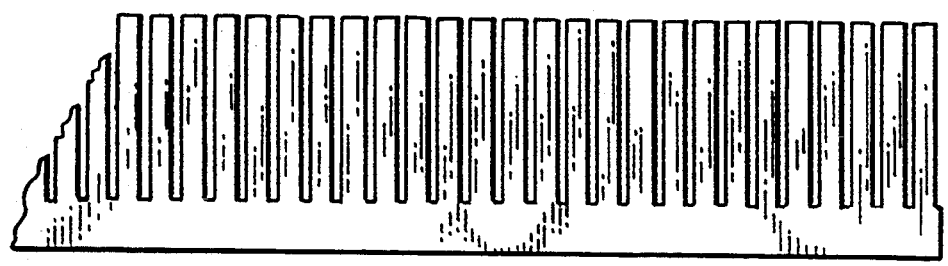
FIG. 9 is a front view of a strip-like member.

Among the above-mentioned steps for manufacturing the pin type radiating fin A, the step for punching out the constituent unitary body 1 may be substituted by the step for making, for example, a strip-like member as shown in FIG. 9 and cutting the same into a suitable length, and thereafter the step for forming the engagement projections 4 and the engagement recesses 5 may follow.

It may also be arranged such that through-holes are properly formed in the connecting element 2 of one of the constituent unitary bodies 1, and connecting rods formed on another one of the constituent unitary bodies 1 are inserted into the through-holes in order to fix the constituent unitary bodies 1 to each other.

In that case, the engagement projections 4 may be eliminated. If the engagement projections 4 are not eliminated, the engagement projections 4 and the engagement recesses 5 are functioned as positioning means.

Of course, the connecting elements 2, etc. may be welded. In this case, if the connecting rods are used, the engagement projections 4 may or may not be eliminated.

In other words, the connecting means such as the connecting elements 2, etc. may be freely selected in accordance with necessity.

In a further modification of the present invention, a spacer (which constitutes, together with the connecting elements 2, the basic plate 7) having a Generally same configuration as the connecting element 2 of the constituent unitary body 1 is interposed between the adjacent constituent unitary bodies 1 to obtain the radiation fin A. In this case, the step for compressing the slender bars 3 may be eliminated.

The reasons why the spacer is interposed between the adjacent constituent unitary bodies and a step portion, in a sense, is formed between the connecting element 2 and the slender bars 3 are that radiation effect is enhanced by satisfactorily flowing air between the adjacent constituent unitary bodies 1. In this sense, there can be contemplated that the step portion is beforehand formed on the material plate 10, and the same is punched out by pressing means.

The material of the constituent unitary elements 1 is, of course, not necessarily limited to aluminum. It suffices as long as the material has a high thermal conductivity (for example, a copper plate is preferable).

Second Embodiment

FIGS. 5 to 8 show a second embodiment of the present invention. In contrast to the first embodiment in which the slender bars 3 are arrayed along the longitudinal one end of the connecting element 2 to constitute the constituent unitary body 1, the second embodiment has a pair of connecting elements 2, and the slender bars 3 are disposed between the connecting elements 2, and the remaining construction of the second embodiment is the same as the first embodiment.

Figure 6:
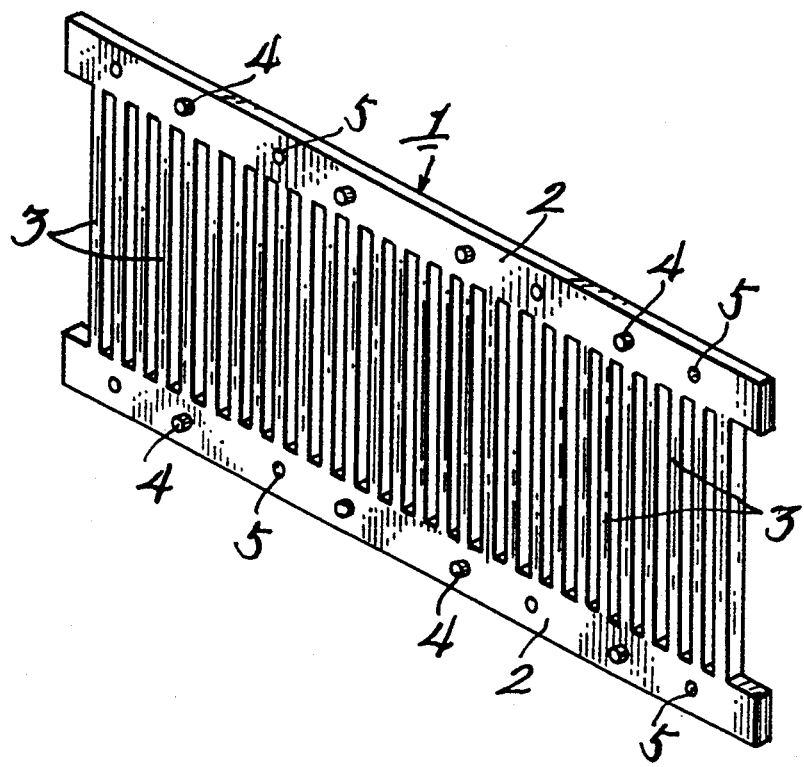
FIG. 6 is a perspective view of one of the constituent unitary bodies of FIG. 5.
Figure 7:
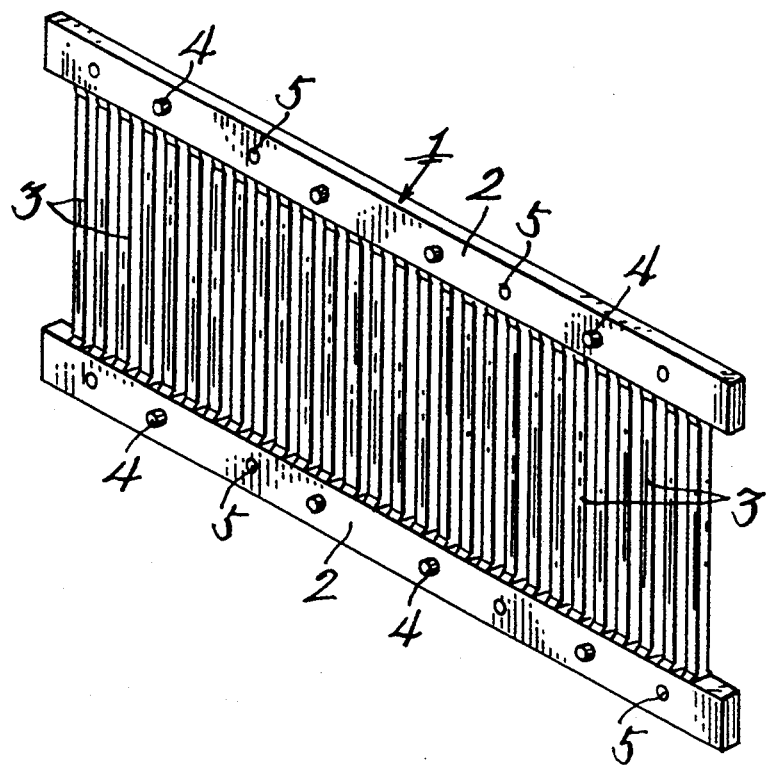
FIG. 7 is a perspective view of the constituent unitary body after it is subjected to secondary treatment.

As shown in FIG. 6, the pin type radiating fin A according to the second embodiment of the present invention has a pair of basic plates 7 on selected one of which the electronic device B is mounted, or on both of which the electronic devices B are mounted respectively to obtain radiation effect.

Figure 8:
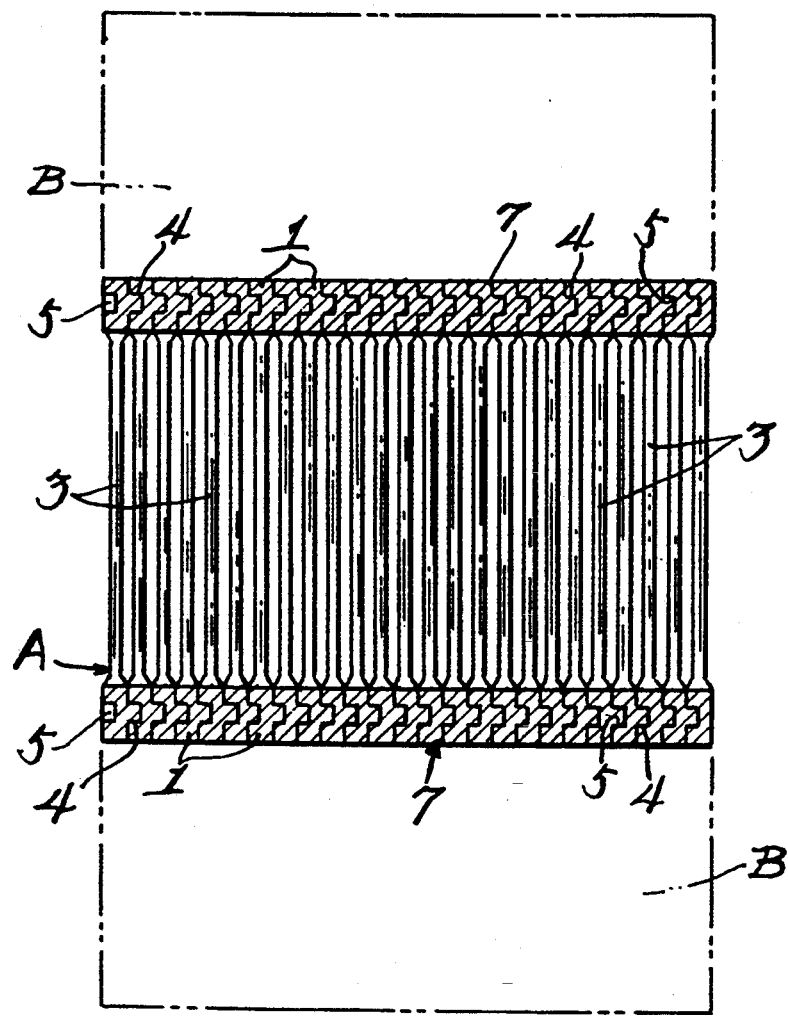
FIG. 8 is a perspective view likewise of a pin type radiating fin.

As indicated by an imaginary line of FIG. 8, if a pair of electronic devices B are mounted on the pin type radiating fin A, the whole apparatus including the electronic devices B can be made small in size and can be functioned as a connecting member for the pair of electronic devices.

Third Embodiment

FIGS. 10 to 12 show a third embodiment of the present invention. In this third embodiment, a material plate 10 having a predetermined sectional configuration as illustrated is obtained by an extruding machine, and then the constituent unitary body 1 is obtained by punching out such obtained material plate 10. By doing this, the compression process of the first embodiment can be eliminated. Since the remainder of this third embodiment is the same as that of the preceding embodiments, description thereof is omitted.

According to the present invention, since a metal plate is punched out to form a constituent unitary body comprising a connecting element and a plurality of slender bars and a plurality of such obtained constituent unitary bodies are connected in superimposed relation at the connecting element portion, there can easily be obtained a small-sized pin type radiating fin in which troublesome handling of the constituent unitary bodies can be avoided as mentioned above. Furthermore, since the slender bars of the constituent unitary body are integral through the connecting element, there can easily be obtained a product in which thermal conduction between the slender bars of the constituent unitary body is efficiently performed.

Moreover, according to a pin type radiating fin of the present invention, since a suitable number of slender bars are disposed between a pair of basic plates, a pair of electronic devices can be mounted in opposite relation through the basic plates in order to obtain a favorable radiation effect. Accordingly, the whole apparatus can be made small in size compared with the conventional one in which an electronic device is mounted on each radiating fin.

What is claimed is:

1. A process for manufacturing a pin type radiating fin comprising:
    forming a plurality of constituent unitary metal plate bodies and each comprising a connecting element and a plurality of successively spaced-apart slender bars each having a respective surface that lies within a common plane; and
    connecting at least two of said plurality of constituent unitary bodies to each other in superimposed relation at said connecting elements respectively, said connecting element including engageable projections and recesses to form said radiating fin.

2. A process for manufacturing a pin type radiating fin as claimed in claim 1, wherein the metal plate has a predetermined configuration which is obtained by extruding the metal plate from an extruding machine.

3. A process for manufacturing a pin type radiating fin as claimed in claim 1, wherein a spacer is interposed between an adjacent two of said connecting elements.

4. A process for manufacturing a pin type radiating fin as claimed in claim 1, further comprising forming engagement projections on one of said connecting elements so that said projections are brought into engagement with said recesses which are formed in an adjacent one of said connecting elements.

5. A process for manufacturing a pin type radiating fin as claimed in claim 1, said plurality of slender bars are disposed between a pair of said connecting elements.

6. A process for manufacturing a pin type radiating fin as claimed in claim 1, wherein said slender bars are thinner than said connecting elements, respectively.

7. A process for manufacturing a pin type radiating fin as claimed in claim 1, further comprising the step of compressing slender bars to be thinner than said connecting elements, respectively.

8. A process for manufacturing a pin type radiating fin as claimed in claim 2, wherein a spacer is interposed between an adjacent two of said connecting elements.

9. A process for manufacturing a pin type radiating fin as claimed in claim 2, further comprising forming said projections on one of said connecting elements so that said projections are brought into engagement with said recesses which are formed in an adjacent one of said connecting elements.

10. A process for manufacturing a pin type radiating fin as claimed in claim 3, further comprising forming engagement projections on one of said connecting elements so that said projections are brought into engagement with engagement recesses which are formed in an adjacent one of said connecting elements.

11. A process for manufacturing a pin type radiating fin as claimed in claim 3, further comprising forming said projections on one of said connecting elements so that said projections are brought into engagement with said recesses which are formed in said spacer.

12. A process for manufacturing a pin type radiating fin as claimed in claim 2, wherein said plurality of slender bars are disposed between a pair of said connecting elements.

13. A process for manufacturing a pin type radiating fin as claimed in claim 3, wherein said plurality of slender bars are disposed between a pair of said connecting elements.

14. A process for manufacturing a pin type radiating fin as claimed in claim 4, wherein said plurality of slender bars are disposed between a pair of said connecting elements.

15. A process for manufacturing a pin type radiating fin as claimed in claim 9, wherein said plurality of slender bars are disposed between a pair of said connecting elements.

16. A process for manufacturing a pin type radiating fin as claimed in claim 10, wherein said plurality of slender bars are disposed between a pair of said connecting elements.

17. A process for manufacturing a pin type radiating fin as claimed in claim 11, wherein said plurality of slender bars are disposed between a pair of said connecting elements.

18. A process for manufacturing a pin type radiating fin as claimed in claim 4, wherein said slender bars are thinner than said connecting elements, respectively.

19. A process for manufacturing a pin type radiating fin as claimed in claim 5, wherein said slender bars are thinner than said connecting elements, respectively.

20. A process for manufacturing a pin type radiating fin as claimed in claim 9, wherein said slender bars are thinner than said connecting elements, respectively.

21. A process for manufacturing a pin type radiating fin as claimed in claim 10, wherein said slender bars are thinner than said connecting elements, respectively.

22. A process for manufacturing a pin type radiating fin as claimed in claim 11, wherein said slender bars are thinner than said connecting elements, respectively.

23. A process for manufacturing a pin type radiating fin as claimed in claim 12, wherein said slender bars are thinner than said connecting elements, respectively.

24. A process for manufacturing a pin type radiating fin as claimed in claim 13, wherein said slender bars are thinner than said connecting elements, respectively.

25. A process for manufacturing a pin type radiating fin as claimed in claim 14, wherein said slender bars are thinner than said connecting elements, respectively.

26. A process for manufacturing a pin type radiating fin as claimed in claim 15, wherein said slender bars are thinner than said connecting elements, respectively.

27. A process for manufacturing a pin type radiating fin as claimed in claim 16, wherein said slender bars are thinner than said connecting elements, respectively.

28. A process for manufacturing a pin type radiating fin as claimed in claim 17, wherein said slender bars are thinner than said connecting elements, respectively.

29. A process for manufacturing a pin type radiating fin as claimed in claim 1, further comprising the step of compressing a portion of the metal plate corresponding to where said slender bars are to be formed during the step of forming so that said slender bars are thinner than said connecting elements, respectively.

30. A process for manufacturing a pin type radiating fin as claimed in claim 1, wherein the step of forming is carried out by punching out the metal plate bodies.

31. A process for manufacturing a pin type radiating fin as claimed in claim 1, wherein said connecting element has a surface that lies within said common plane.

* * * * *